United States Patent [19]
Lee et al.

[11] Patent Number: 5,498,880
[45] Date of Patent: Mar. 12, 1996

[54] IMAGE CAPTURE PANEL USING A SOLID STATE DEVICE

[75] Inventors: Denny L. Y. Lee, West Chester, Pa.; Lothar S. Jeromin, Newark; William Bindloss, Wilmington, both of Del.

[73] Assignee: E. I. Du Pont de Nemours and Company, Wilmington, Del.

[21] Appl. No.: 371,904

[22] Filed: Jan. 12, 1995

[51] Int. Cl.$^6$ ............................ G01N 23/04; H01L 27/14
[52] U.S. Cl. .................... 250/580; 250/370.09; 257/444
[58] Field of Search ............................ 250/580, 370.09, 250/370.11; 257/59, 444

[56] References Cited

U.S. PATENT DOCUMENTS

| | | | |
|---|---|---|---|
| 3,973,146 | 8/1976 | Arnold et al. | 357/26 |
| 4,467,342 | 8/1984 | Tower | 357/30 |
| 4,670,765 | 6/1987 | Nakamura et al. | 357/30 |
| 4,672,454 | 6/1987 | Canella et al. | 358/213.11 |
| 4,694,317 | 9/1987 | Higashi et al. | 357/30 |
| 4,755,681 | 7/1988 | Oka et al. | 250/370.01 |
| 4,770,965 | 9/1988 | Fender et al. | 430/66 |
| 4,803,359 | 2/1989 | Hosoi et al. | 250/586 |
| 4,810,881 | 3/1989 | Berger et al. | . |
| 4,857,723 | 8/1989 | Modisette | 230/213 R |
| 4,861,995 | 8/1989 | Ohgoda | 250/327 |
| 4,873,708 | 10/1989 | Cusano et al. | 378/62 |
| 4,931,643 | 6/1990 | Amtmann | 250/327 |
| 4,961,209 | 10/1990 | Rowlands et al. | 378/29 |
| 4,975,935 | 12/1990 | Hillen et al. | 378/28 |
| 5,043,582 | 8/1991 | Cox et al. | 250/366 X |
| 5,070,248 | 12/1991 | Pesce | 250/483 |
| 5,105,087 | 4/1992 | Jagielinski | 250/370.09 |
| 5,127,038 | 6/1992 | Jeromin et al. | 378/28 |

(List continued on next page.)

FOREIGN PATENT DOCUMENTS

| | | | |
|---|---|---|---|
| 0125691A2 | 11/1984 | European Pat. Off. | H01L 31/16 |
| 63-3454 | 1/1988 | Japan | H01L 27/14 |

OTHER PUBLICATIONS

L. E. Antonuk et al., Development of Hydrogenated Amorphous Silicon Sensors for High Energy Photon Radiotherapy Imaging, *IEEE Transactions on Nuclear Science*, 37, No. 2, 165–170, Apr. 1990.

L. E. Antonuk et al., Development of Hydrogenated Amorphous Silicon Sensors for Diagnostic X–Ray Imaging *IEEE Transactions on Nuclear Science*, 38, No. 2, 636–640, Apr. 1991.

L. E. Antonuk et al., Signal, Noise, and Readout Considerations in the Development of Amorphous Silicon Photodiode Arrays for Radiotherapy and Diagnostic X–Ray Imaging, *SPIE*, 1443 Medical Imaging V: Image Physics, 108–119, (1991).

L. E. Antonuk et al., Development of Thin–Film, Flat–Panel Arrays for Diagnostic and Radiotherapy Imaging, *Conference Proceedings of SPIE Medical Imaging V*, Newport Beach, CA, Feb. 23–27, 1992.

L. E. Antonuk et al., Large Area Amorphous Silicon Photodiode Arrays for Radiotherapy and Diagnostic Imaging, *Nuclear Instruments and Methods in Physics Research*, A310 (1991), pp. 460–464.

W. Zhao et al., A Large Area Solid–State Detector for Radiology Using Amorphorous Selenium, *Medical Physics Research*, Reichmann Research Building 2075, Bayview Avenue, Toronto, Ontario M4N 3M5, Canada.

*Primary Examiner*—David L. Willis
*Assistant Examiner*—Richard Hanig
*Attorney, Agent, or Firm*—Thomas H. Magee

[57] ABSTRACT

An image capture panel includes a substrate layer of dielectric material having a top surface and a bottom surface. A plurality of sensors is arrayed in a matrix of rows and columns adjacent the top surface of the substrate layer. Each of the sensors has a switching device and a sensing element. A portion of the sensing element are really covers the switching device so as to be substantially coextensive therewith. Prefereably, the sensing element also extends over at least a part of the horizontal spacing and/or the vertical spacing which separates, respectively, each row of sensors and each column of sensors.

8 Claims, 3 Drawing Sheets

U.S. PATENT DOCUMENTS

| | | | |
|---|---|---|---|
| 5,151,588 | 9/1992 | Kiri et al. | 250/370.09 X |
| 5,166,524 | 11/1992 | Lee et al. | 250/580 |
| 5,182,624 | 1/1993 | Tran et al. | 257/40 |
| 5,220,170 | 6/1993 | Cox et al. | 250/370.09 |
| 5,254,480 | 10/1993 | Tran . | |
| 5,262,649 | 11/1993 | Antonuk et al. . | |
| 5,315,101 | 5/1994 | Hughes et al. | 250/108.1 |
| 5,319,206 | 6/1994 | Lee et al. . | |
| 5,331,179 | 7/1994 | Lee et al. | 250/591 |
| 5,420,452 | 5/1995 | Tran et al. | 257/444 |

IMAGE CAPTURE PANEL USING A SOLID STATE DEVICE

BACKGROUND OF THE INVENTION

1. Field of the Invention

The present invention pertains to an apparatus for capturing digital radiographic images. More particularly, the present invention relates to a sensor panel for capture and read-out of electrical charges representing a latent radiographic image using an array of sensors having an extended charge collecting element to obtain an electrical signal representing a radiogram.

2. Description of the Related Art

Radiograms have been produced by using a radiation-sensitive layer to capture a latent radiographic image, as contrasted with traditional radiography which employs a silver halide photosensitive film. Depending on the intensity of the incident radiation, charges are generated within a pixel (picture element) defining the smallest resolvable image area, either electrically or optically by the X-ray radiation, and are quantized using a regularly arranged array of discrete sensors, each of which includes a switching device for read-out. U.S. Pat. No. 5,319,206, issued to Lee et al. on Jun. 7, 1994 and assigned to E. I. du Pont de Nemours and Company, describes a system employing a photoconductive layer to create an image-wise modulated a real distribution of electron hole pairs which are subsequently converted to corresponding analog pixel values by an electrosensitive device, such as a thin-film transistor. U.S. Pat. No. 5,262,649, issued to Antonuk et al. on Nov. 16, 1993 and assigned to University of Michigan, describes a system employing a phosphor or scintillation layer to create a distribution of photons which are subsequently converted to a corresponding image-wise modulated distribution of electrical charges by a photosensitive device, such as an amorphous silicon diode. U.S. Pat. No. 5,254,480, issued to Tran on Oct. 19, 1993 and assigned to 3M Company, describes a system which combines a luminescent layer to create a distribution of photons with an adjacent photoconductive layer to create a corresponding image-wise modulated distribution of electrical charges which are subsequently converted to corresponding analog pixel values by an electrosensitive device.

A common characteristic of all these systems is that the electrosensitive or photosensitive devices capture signal charges within discrete pixel areas confined by typically orthogonally intersecting columns and rows of non-pixel spacings. This feature detracts from the image-wise modulated a real distribution of electrical charges available for read-out. Another characteristic of these systems is that the switching device itself may be adversely affected by electrical charges which are not removed by the charge-collecting portion of the sensor and, thus, remain in proximity to the active portion of the switching device. A further characteristic of these systems is that the signal charges captured within each pixel area are partially limited by the area occupied by the switching device. All of these characteristics combine to reduce the signal-to-noise ratio of the captured pixel values, thereby reducing the quality of the imaging process or possibly requiring an increased radiation exposure of a patient being examined.

SUMMARY OF THE INVENTION

The present invention provides an image capture panel including a substrate layer of dielectric material having a top surface and a bottom surface. A plurality of sensors is arrayed in a matrix of rows and columns adjacent the top surface of the substrate layer. Each of the sensors has a switching device and a sensing element. A portion of the sensing element areally covers the switching device so as to be substantially coextensive therewith. Preferably, the sensing element also extends over at least a part of the horizontal spacing and/or the vertical spacing which separates, respectively, each row of sensors and each column of sensors.

DETAILED DESCRIPTION OF THE PREFERRED EMBODIMENT

Figure 1:
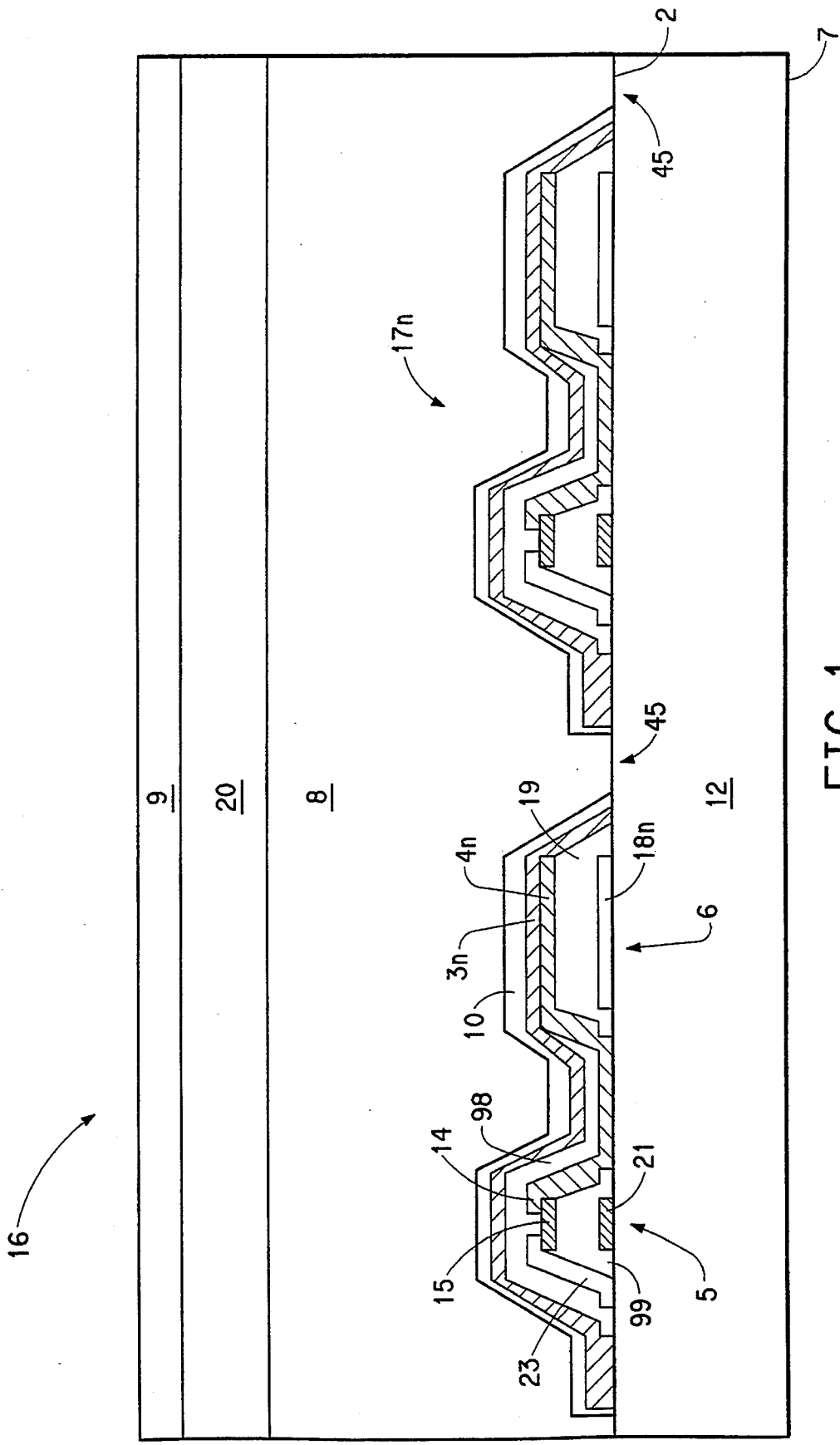
FIG. 1 is a schematic cross-sectional view of an image capture panel in accordance with the present invention.

FIG. 1 shows an image capture panel 16 with a substrate layer 12 having a top surface 2 and a bottom surface 7. The substrate layer 12 has a thickness of dielectric material sufficient to facilitate handling of the panel 16. Disposed over the substrate layer 12 is a plurality of sensors 17 (ie., 17a, 17b, 17c, . . . 17n) referred to herein as sensors 17n arrayed in a two-dimensional matrix of rows and columns adjacent the top surface 2 of the substrate layer 12. Each row of sensors 17n is separated by a horizontal spacing 41, and each column of sensors 17n is separated by a vertical spacing 43 (shown in FIG. 3). Each sensor 17n comprises at least one of a first plurality of discrete minute conductive electrodes 18 (ie., 18a, 18b, 18c, . . . 18n) referred to herein as microplates 18n. Preferably, the microplates 18n are made of aluminum. They are deposited on the substrate layer 12, typically, though not necessarily, using thermal deposition or sputtering techniques well known in the art, and can be made of a very thin film of metal such as gold, silver, copper, chromium, indium-tin oxide, titanium, platinum or the like. Over this first plurality of microplates 18n is applied a capacitive dielectric material 19, preferably comprised of silicon dioxide; other materials such as silicon nitride may be used. Also deposited on the substrate layer 12 is a plurality of switching devices 5, preferably transistors, having two electrodes 23 and 14 and a gate 21. Each switching device 5 is covered with a passivation layer 98.

FIG. 1 further shows a second plurality of microplates 4 (ie., 4a, 4b, 4c, . . . 4n) referred to herein as microplates 4n, each microplate 4n also being a part of each sensor 17n. The microplates 4n are deposited over the substrate layer 12 typically using vacuum thermal deposition or sputtering techniques, and can be made of a very thin film of metal such as gold, silver, copper, chromium, titanium, platinum or the like. Preferably, the microplates 4n are made of aluminum or indium-tin oxide.

An important feature of the present invention is a plurality of discrete conductive collecting elements 3 (ie., 3a, 3b, 3c, . . . 3n), referred to herein as conductive collecting elements 3n, connected to the microplates 4n. The conductive collecting elements 3n are deposited, respectively, over the switching devices 5 and passivation layer 98. The presence of the conductive collecting element 3n over the switching device 5 serves an important function of conducting, away from the underlying switching device 5, electric charges that may be created within the sensor 17n by repeated exposure of the image capture panel 16 to incident radiation. The electric field from these unwanted electric charges may adversely affect the switching characterisitcs of the switching device 5. Since the conductive collecting elements 3n are connected to the microplates 4n, charges accumulated above the switching devices 5 will be removed by the panel 16 during a read-out step and will not be available to create a deleterious electric field.

Figure 2:
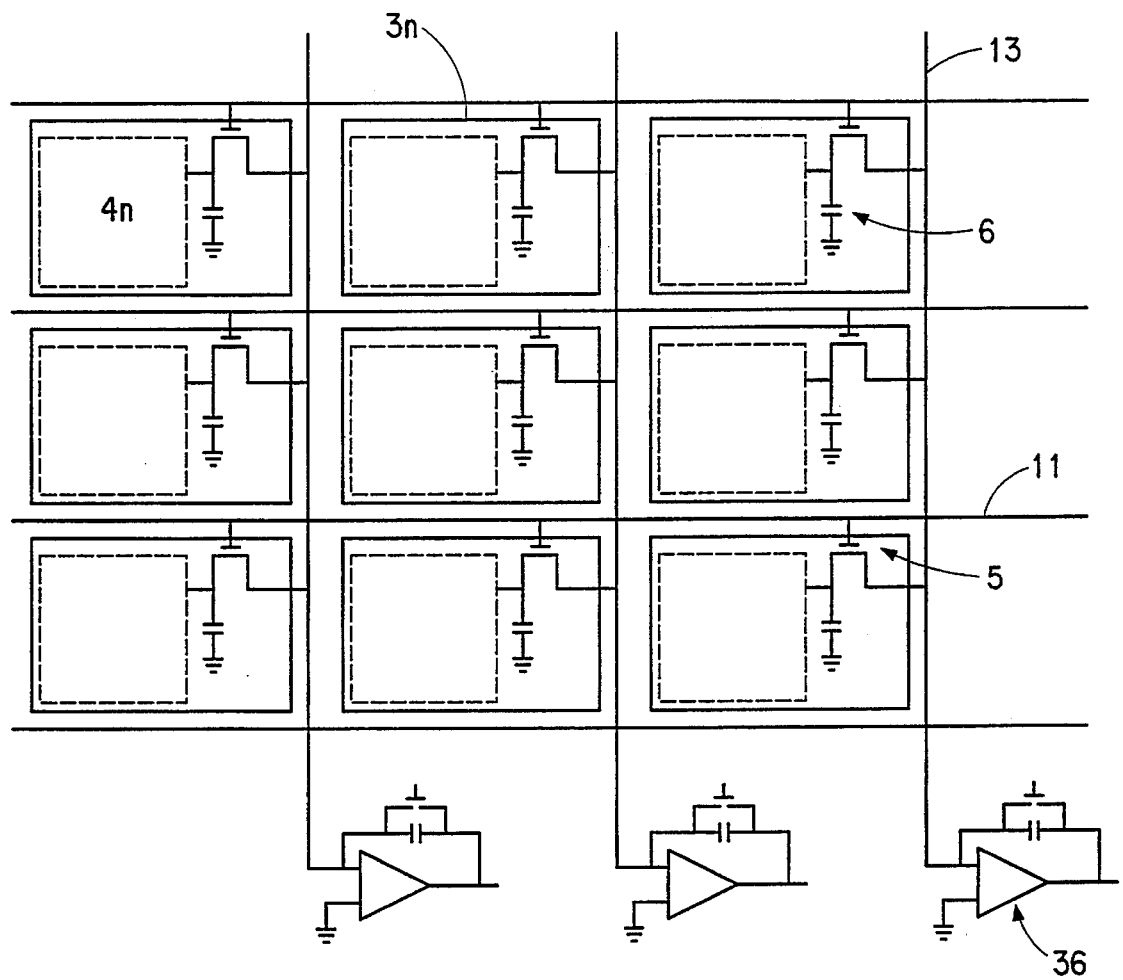
FIG. 2 is a schematic top view of the image capture panel shown in FIG. 1.

FIG. 2 shows at least one switching device 5 connected to each microplate 4n. Each switching device 5 has its gate 21 connected to an Xn line 11 and its source or drain connected to a Yn line 13. A charge storage 5 capacitor 6 is formed by the microplates 4n and 18n and the capacitive dielectric material 19. Each microplate 4n is also connected to electrode 14 of the switching device 5. Each microplate 18n is connected to electrical ground using a line not shown. Each switching device 5 serves as a bi-directional switch allowing current flow between the Yn sense lines 13 and the charge storage capacitor 6 depending on whether a bias voltage is applied to its gate 21 through Xn address lines 11. The switching device 5 is preferably a thin-film field effect transistor (FET) comprising a hydrogenated amorphous-silicon layer 15, an insulating layer 99, a conductive gate 21 and the two conductive electrodes, one electrode 23 being connected to the Yn sense lines 13 and the other electrode 14 to the microplates 4n, as shown in FIG. 1. Each transistor could also use crystalline silicon, polycrystalline silicon or cadmium selenide. Each transistor is also covered with a passivation layer 98, preferably having a thickness greater than the thickness of the dielectric material 19. The technology for creating the transistors and charge storage capacitors 6 is well known in the art and not a subject of the present invention. See, for instance, "Modular Series on Solid State Devices," Volume 5 of Introduction to Microelectronics Fabrication by R. C. Jaeger, published by Addison-Wesley in 1988.

Means for electronically accessing each switching device 5 individually are disposed adjacent the top surface 2 of substrate layer 12. Preferably, conductive electrodes or X1, X2, ... Xn address lines 11 and conductive electrodes or Y1, Y2, ... Yn sense lines 13 are laid out in horizontal spacings 41 and vertical spacings 43 between the sensors 17n. The Xn address lines 11 are individually accessible through leads or connectors, not specifically illustrated in the drawings, along the sides or edges of the panel 16. The Xn lines 11 and Yn lines 13 may be constructed from the same aluminum layer used for fabricating the microplates 4n. The Yn lines 13 may be created after placing an insulating layer, not shown, over the Xn lines 11, since the Xn lines 11 and Yn lines 13 should not electrically contact each other.

Over the top surface of the conductive collecting elements 3n there is applied a charge blocking layer 10 having a thickness selected to prevent charge leakage. The charge blocking layer 10 is preferably provided by an aluminum oxide layer formed on the conductive collecting elements 3n, although other blocking interfaces, such as indium-tin oxide, may also be used.

A photoconductive layer 8 is coated over the charge blocking layer 10, the address and sense lines 11 and 13, and the horizontal spacings 41 and vertical spacings 43, thereby producing an X-ray absorption layer. The combination of layers 3n, 10 and 8 behaves as a blocking diode, inhibiting one type of charge flow in one direction. The photoconductive layer 8 preferably exhibits very high dark resistivity and may comprise amorphous selenium, lead oxide, thallium bromide, cadmium telluride, cadmium sulfide, mercuric iodide or any other such material, including organic materials such as photoconductive polymers preferably loaded with X-ray absorbing compounds, which exhibit photoconductivity. In a preferred embodiment of the present invention, the photoconductive layer 8 comprises about 300 to 500 micrometers of selenium, which provides high efficiency in radiation detection, and the charge blocking layer 10 has a thickness greater than 100 Angstroms. In the context of the present invention, exhibiting photoconductivity means that upon exposure to X-ray radiation, the photoconductive material exhibits reduced resistivity relative to that in the absence of such exposure. The reduced resistivity results from electron hole pairs generated in the material by the incident radiation. Preferably, the charges moving across the photoconductive layer 8 are directly proportional to the intensity of the incident radiation.

A dielectric layer 20 having have a thickness greater than one micrometer is added on the top front surface of the photoconductive layer 8. Mylar® (i.e., polyethylene terephthalate) film with a thickness of 25 micrometers may be laminated for the layer 20, or a dielectric material such as pyralene may be deposited for the layer 20. A final top layer 9 of conductive material transparent to X-ray radiation is formed over the dielectric layer 20.

Figure 3:
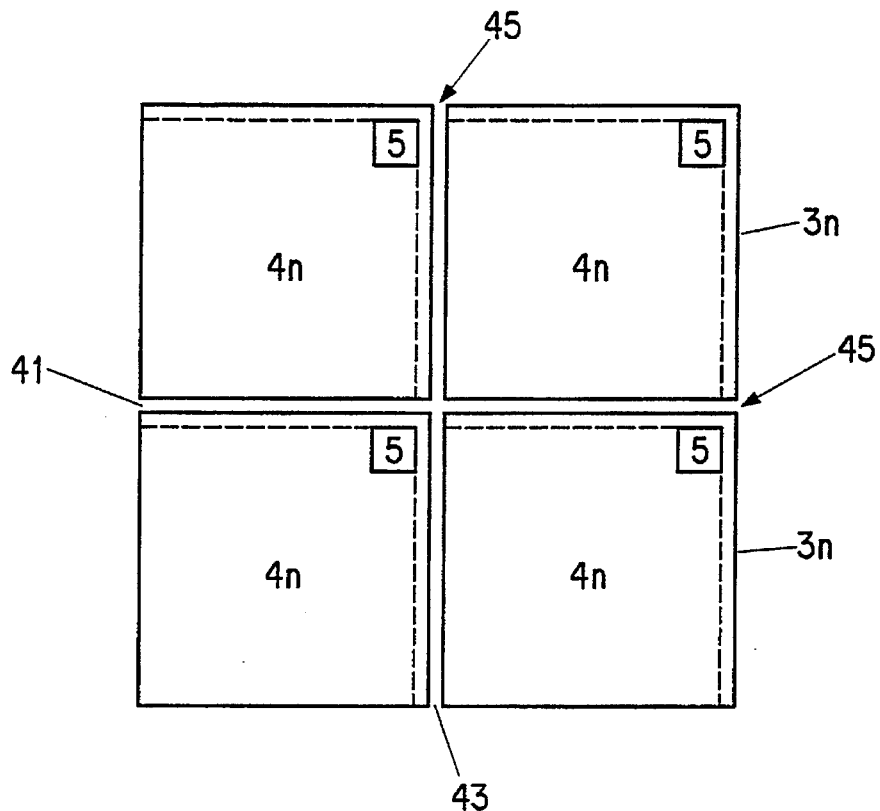
FIG. 3 is another schematic top view of the image capture panel shown in FIG. 1 illustrating the present invention.

FIG. 3 shows the sensors 17n arrayed in a two-dimensional matrix of rows and columns adjacent the top surface 2 of the substrate layer 12, each row of sensors 17n being separated by a horizontal spacing 41 and each column of sensors 17n being separated by a vertical spacing 43. Each sensor 17n has a switching device 5 and a charge storage capacitor 6. In order to faciliate illustration of the present invention, the microplates 4n are shown with a dashed line, and the conductive collecting elements 3n are shown with a solid line. The typical center-to-center distance between the sensors 17n is about 100 to 200 micrometers, and the horizontal spacings 41 and vertical spacings 43 are typically about 25 to 30 micrometers in gap 45 width. The address lines 11 and the sense lines 13 are typically 15 micrometers in width.

FIG. 3 shows a further important feature of the present invention wherein the conductive collecting element 3n is disposed to extend beyond the area occupied by the switching device 5, as described before, so as to cover at least a part of the adjacent horizontal spacing 41 and/or a part of the adjacent vertical spacing 43. As a consequence of positioning the conductive collecting element 3n over the switching device 5 and over at least a part of the horizontal and or vertical spacings 41 and 43, the physical image capturing area is also increased so that the geometric fill factor is increased. Fill factor is a term used to represent the ratio between the active area in a pixel and the total area of the pixel. In the present panel 16, this will be the fraction of area in each sensor 17n which is effective in collecting charges generated by X-rays.

Figure 4:
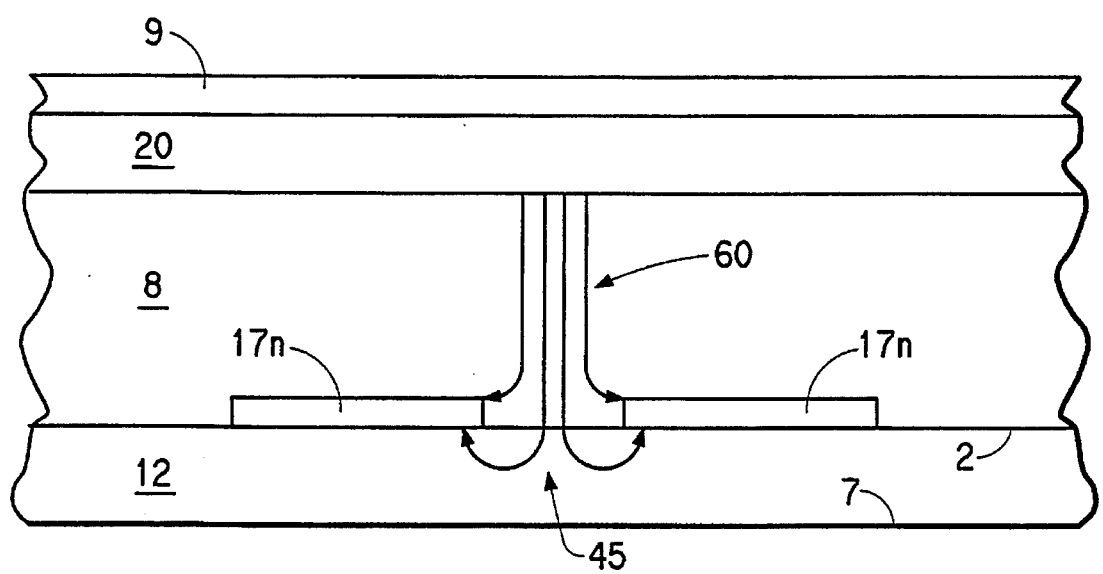
FIG. 4 is a partial schematic cross-sectional view of the image capture panel illustrating the present invention.

FIG. 4 illustrates the unexpected benefit of positioning the conductive collecting elements 3n over part of the horizontal spacings 41 and/or vertical spacings 41 which do not contain electronic structure, for example, the address lines 11 and/or sense lines 13. In this embodiment of the present invention, the electric fringe field 60 will take the form shown in the FIG. 4. About one-half of the charges generated by radiation incident on the photoconductive layer 8 over the gap 45 adjacent each sensor 17n is captured by the conductive collecting elements 3n covering that sensor 17n. The effective "fill factor", as determined by the ratio of the effective charge collecting area to the area between centerlines of the horizontal spacing 41 and the vertical spacing 43, is thereby increased above that expected from geometric dimensions only, and the resultant signal-to-noise performance of the sensors 17n is simultaneously unexpectedly increased. The effective fill factor is increased, for example, from about 50–60% to about 90% for the instance wherein the conductive collecting element 3n is extended in a 129 micrometer square sensor to cover a 30 by 50 micrometer square switching element, and wherein the conductive collecting element 3n is also extended about one-half the width of an adjacent 10 micrometer horizontal and adjacent 10 micrometer vertical spacing surrounding the 129 micrometer square sensor.

The entire panel 16 can be made by depositing the sensors 17n, charge blocking layers 10, photoconductive layer 8, dielectric layer 20, and top conducting layer 9 upon a dielectric substrate layer 12. The switching devices 5 are built in the spaces between the microplates 18n on the substrate layer 12. Fabrication may be accomplished, for example, by plasma-enhanced chemical vapor deposition, vacuum deposition, lamination, or sputtering.

As shown in FIG. 2, each Yn line 13 is connected to a charge amplifying detector 36, typically an operational amplifier, to measure the charge from the capacitors 6. Each detector 36 produces a voltage output proportional to such charge and, consequently, to the intensity of the radiation incident on that sensor 17n. The output of the detectors 36 may be sampled sequentially to obtain an output signal, and the technology to do this is also well known in the art. Also, in FIG. 1, in addition to the circuitry connected to the panel 16 and Xn lines 11 and Yn lines 13 discussed above, there is provided an additional connection for accessing the top conducting layer 9 and the first plurality of microplates 18n in order to electrically connect the top conducting layer 9 and the first plurality of microplates 18n to a power supply (not shown) capable of providing operating voltages.

During X-ray exposure, image-wise modulated X-ray radiation impinges on the panel 16. The X-rays generate excess electron hole pairs within the photoconductive layer 8 and, in the presence of the electric field caused by the difference in voltage between the top conducting layer 9 and the microplates 18n, holes migrate toward the interface between the photoconductive layer 8 and the charge blocking layers 10 in the region above the conductive collecting elements 3n. The amount of electron hole pairs generated throughout the photoconductive layer 8 is dependent on the intensity of image-wise modulated X-ray radiation impinging on the image capture panel 16. The charge blocking layers 10 and the barrier dielectric layer 20 combine to prevent charge build-up on the charge storage capacitors 6 due to leakage current. When a positive operating voltage is applied to the top conducting layer 9, the barrier dielectric layer 20 prevents holes from being injected into the photoconductive layer 8 from the top conducting layer 9, and the charge blocking layers 10 prevent electrons from being injected into the photoconductive layer 8 from the charge collecting elements 3n, thereby preventing any resulting leakage current across the photoconductive layer 8 from causing additional charge build-up on the storage capacitors 6 which is not due to the X-ray image.

After a predetermined time period, the radiation is stopped and X-rays no longer impinge on the image capture panel 16. The application of the operating voltage to the top conducting layer 9 is then removed, thereby capturing a radiographic image in the panel 16 in the form of an image-wise modulated charge distribution in the capacitors 6 formed by the microplates 4n and 18n and the dielectric material 19. The switching devices 5 are sequentially addressed and made conductive by applying an appropriate trigger voltage to the Xn lines 11 and, thus, to the gates 21 of the switching devices 5. This causes the charges stored in the corresponding charge storage capacitors 6 to flow through the Yn lines 13 to the input of the charge detectors 36. The charge detectors 36 produce a voltage output proportional to the charge detected on the respective Yn line 13. The output of the charge amplifying detectors 36 is sequentially sampled to obtain an electrical signal representing the charge distribution in the charge storage capacitors 6, each capacitor representing one pixel of the image. After the signals from one row of pixels along an Xn line 11 are read out, the next Xn line 11 is addressed and the process repeated until all the charge storage capacitors 6 have been sampled and the full image has been read out.

In the present invention, the electronic shielding coverage provided by the conductive collecting elements 3n over the switching devices 5 maintains the integrity of the switching characterisitcs of the switching devices 5. In the absence of conductive collecting elements 3n over the switching devices 5, electric charges generated by repeated exposures to radiation, which accumulate and are trapped within the photoconductive layer 8 at the interface between the charge blocking layers 10 and photoconductive layer 8, could create a spurious electric field and adversely affect the switching devices 5, thereby degrading the resolution of the resultant X-ray image. By conducting away electric charges, present in the proximity of the switching devices 5, to the microplates 4n connected to the source electrodes 14 of the switching devices 5, this adverse effect is eliminated.

Furthermore, the present invention of extending a conductive collecting element 3n beyond the area occupied by the switching device 5 to cover at least a part of the adjacent horizontal spacing 41 and/or a part of the adjacent vertical spacing 43, increases the electrically effective "fill factor" beyond the geometric "fill factor", as previously illustrated in FIG. 3. The resultant increase in image capture efficiency is beneficial in allowing reduced radiation exposures to an examination patient.

What is claimed is:

1. In an image capture panel, including a substrate layer of dielectric material having a top surface and a bottom surface, and a plurality of sensors arrayed in a matrix of rows and columns adjacent the top surface of said substrate layer, each of said sensors having a switching device and a sensing element, the improvement comprising a portion of said sensing element areally covering the switching device so as to be substantially coextensive therewith.

2. A panel in accordance with claim 1 wherein each row of sensors is separated from an adjacent row by a horizontal spacing and each column of sensors is separated from an adjacent column by a vertical spacing, and wherein said sensing element also extends over at least a part of the adjacent horizontal spacing and/or the adjacent vertical spacing.

3. A panel in accordance with claim 2 further comprising means disposed adjacent the top surface of said substrate layer for electronically accessing each of said switching devices individually.

4. A panel in accordance with claim 3 wherein each switching device comprises a thin-film field effect transistor (FET) having a source connected to said sensing element, and a drain and a gate both connected to said means for accessing.

5. A panel in accordance with claim 3 wherein each sensing element comprises:

a conductive microplate connected to at least one of said switching devices;

a conductive collecting element connected to said microplate, said conductive collecting element having a top surface opposite said substrate layer;

a photoconductive layer disposed over said conductive collecting element;

a barrier dielectric layer disposed over the photoconductive layer; and a top conducting layer disposed over the barrier dielectric layer.

6. A panel in accordance with claim 5 further comprising a charge blocking layer disposed adjacent the top surface of each conductive collecting element.

7. A panel in accordance with claim 5 wherein said photoconductive layer is disposed over said means for accessing.

8. A panel in accordance with claim 5 wherein said photoconductive layer, said barrier dielectric layer and said top conducting layer are disposed, respectively, as continuous layers over said conductive collecting elements.

* * * * *